United States Patent
Franzon et al.

(10) Patent No.: US 9,077,245 B2
(45) Date of Patent: Jul. 7, 2015

(54) AC POWERED LOGIC CIRCUITS AND SYSTEMS INCLUDING SAME

(75) Inventors: Paul D. Franzon, New Hill, NC (US); Peter Gadfort, Raleigh, NC (US); Joshua Chris Ledford, Angier, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 55 days.

(21) Appl. No.: 13/615,412

(22) Filed: Sep. 13, 2012

(65) Prior Publication Data

US 2013/0069709 A1   Mar. 21, 2013

Related U.S. Application Data

(60) Provisional application No. 61/535,657, filed on Sep. 16, 2011.

(51) Int. Cl.

| | |
|---|---|
| *H03K 19/094* | (2006.01) |
| *H03K 19/20* | (2006.01) |
| *H02M 7/217* | (2006.01) |
| *H02M 7/219* | (2006.01) |

(52) U.S. Cl.
CPC .............. *H02M 7/217* (2013.01); *H03K 19/094* (2013.01); *H02M 2007/2195* (2013.01); *Y02B 70/1408* (2013.01)

(58) Field of Classification Search
None
See application file for complete search history.

(56) References Cited

U.S. PATENT DOCUMENTS

| | | | |
|---|---|---|---|
| 2006/0214697 A1* | 9/2006 | Baude et al. | 326/121 |
| 2011/0124310 A1* | 5/2011 | Theilmann et al. | 455/343.1 |

OTHER PUBLICATIONS

Ledford, Josh et al., "An Analysis of Subthreshold SRAM Bitcells for Operation in Low Power RF-only Technologies," Student Paper—Oral Presentation, North Carolina State University, p. 1, (2011).

Vitale, Steven A. et al., "Work-Function-Tuned TiN Metal Gate FDSOI Transistors for Subthreshold Operation," IEEE Transactions on Electron Devices, vol. 58, No. 2, pp. 419-426 (Feb. 2011).

Kotani, Koji et al., "High-Efficiency Differential-Drive CMOS Rectifier for UHF RFIDs," IEEE Journal of Solid-State Circuits, vol. 44, No. 11, pp. 3011-3018 (Nov. 2009).

Wenck, Justin et al., "AC Power Supply Circuits for Energy Harvesting," 2007 IEEE Symposium on VLSI Circuits, Digest of Technical Papers, pp. 92-93 (Jun. 2007).

(Continued)

*Primary Examiner* — Jany Richardson
(74) *Attorney, Agent, or Firm* — Jenkins, Wilson, Taylor & Hunt, P.A.

(57) ABSTRACT

AC powered logic circuits and systems including same are disclosed. According to one aspect, a system including a logic circuit powered using an alternating current (AC) power source includes at least one supply transistor connected to receive voltages of opposite phases from an AC power source such that the at least one supply transistor is strongly on during a first phase of the voltage of the AC power source and is strongly off during a second phase opposite the first phase of the voltage of the AC power source and at least one logic circuit connected to be powered by the AC power source through the at least one supply transistor and producing an output at an output terminal responsive to an input received at an input terminal.

28 Claims, 16 Drawing Sheets

(56) References Cited

OTHER PUBLICATIONS

Kim,Tae-Hyoung et al., "A 0.2 V, 480 kb Subthreshold SRAM With 1 k Cells Per Bitline for Ultra-Low-Voltage Computing," IEEE Journal of Solid-State Circuits, vol. 43, No. 2, pp. 518-529, (Feb. 2008).

Briole, S. et al., "AC-Only RF ID Tags for Barcode Replacement," 2004 IEEE International Solid-State Circuits Conference, Session 24, TD: Wireless Trends: Low-Power and 60GHz / 24.3, pp. 1-10 (Feb. 2004).

* cited by examiner

AC POWERED LOGIC CIRCUITS AND SYSTEMS INCLUDING SAME

PRIORITY CLAIM

This application claims the benefit of U.S. Provisional Patent Application Ser. No. 61/535,657, filed Sep. 16, 2011; the disclosure of which is incorporated herein by reference in its entirety.

TECHNICAL FIELD

The subject matter described herein relates to logic circuits for applications which harvest power from ambient AC or RF fields. More particularly, the subject matter described herein relates to AC powered logic circuits and systems including same.

BACKGROUND

Conventional digital logic circuits require a stable direct current (DC) power, which may be supplied by a DC power source, such as a battery, or from an alternating current (AC) power supply that is rectified to produce DC power to supply the circuit. Devices such as radio frequency identification circuits (RFIDs) are typically very small devices that are powered by the radio frequency (RF) signals used to communicate with the device. For example, an RFID device may use RF signal received by the communication antenna as the input into a diode bridge rectifier, where the output of the rectifier is the DC power supply for the logic circuits of the RFID device. The use of ambient AC signals as a source of power is commonly referred to as "power harvesting."

One disadvantage to conventional devices that employ power harvesting to power logic circuits, however, is that the rectifier circuit can be bulky relative to the digital logic circuit. Another disadvantage is that, because bridge rectifiers use diodes, the peak-to-peak amplitude of the RF signal output from the antenna must be more than twice the diode drop, e.g., $V_{RF} > 2 \times V_{DIODE}$. For most technologies, $V_{DIODE}$ is 0.5V or greater. Thus, the usefulness of conventional RF to DC converters is limited to about 1V RMS.

As a result, conventional RF powered digital circuits have several disadvantages, such as that they only work at low frequencies and require the recovered RF supply voltage to be greater than the threshold voltage, which limits the range (i.e., the distance from the source of the RF signal) at which the RF powered circuit can operate. Another disadvantage is that conventional RF powered digital circuits require power-on-reset circuits to save their results to DRAM, which hold the stored bit during the circuits' off time. Yet another disadvantage is that in an RF powered application, the recovered voltage is limited by the size of the antenna, the number of turns in the loop, the quality of the matching network, the complexity of the rectification circuit, and the distance and orientation to the RF source. Thus, there is a correlation between the size of the RFID device and its operating range. A smaller RFID is desired, but reducing the size of the RFID device reduces the range, which is undesired. Any reduction in the required AC operating voltage would increase the operating range of a RFID device without an increase in size of the RFID device, which is a significant benefit.

It would therefore be desirable to have AC powered logic devices that operate at lower field strengths with lower requirements on RF voltage, especially in applications driven by RF power harvesting. Accordingly, in light of these disadvantages associated with conventional power harvesting in general and with RF powered digital circuits in particular, there exists a need for AC powered logic circuits and systems including same.

SUMMARY

According to one aspect, the subject matter described herein includes a system including a logic circuit powered using an alternating current (AC) power source. The system includes at least one supply transistor connected to receive voltages of opposite phases from an AC power source such that the at least one supply transistor is strongly on during a first phase of the voltage of the AC power source and is strongly off during a second phase opposite the first phase of the voltage of the AC power source. The system also includes at least one logic circuit connected to be powered by the AC power source through the at least one supply transistor and producing an output at an output terminal responsive to an input received at an input terminal.

The subject matter described herein can be implemented in hardware or hardware in combination with software and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

In accordance with the subject matter disclosed herein, AC powered logic circuits and systems including same are provided. Reference will now be made in detail to exemplary embodiments of the present invention, examples of which are illustrated in the accompanying drawings. Wherever possible, the same reference numbers will be used throughout the drawings to refer to the same or like parts.

The subject matter described herein includes AC powered circuits that operate at subthreshold voltages, do not require conventional rectifier circuits, and can operate at RF frequencies that are higher than conventional RF-powered circuits, making them well suited for long range RFID and power harvesting from communications or networking infrastructure. These circuits feature a supply transistor configuration that enables subthreshold operation directly from a RF source and can be built with standard CMOS logic with no modifications. A storage cell may be used hold the data during the times where the RF voltage is too low to power the circuits. It should be noted that the detailed descriptions below may refer to RF sources, but the subject matter applies to a wide range of AC frequencies, not just those traditionally referred to as "radio frequencies."

Figure 1:
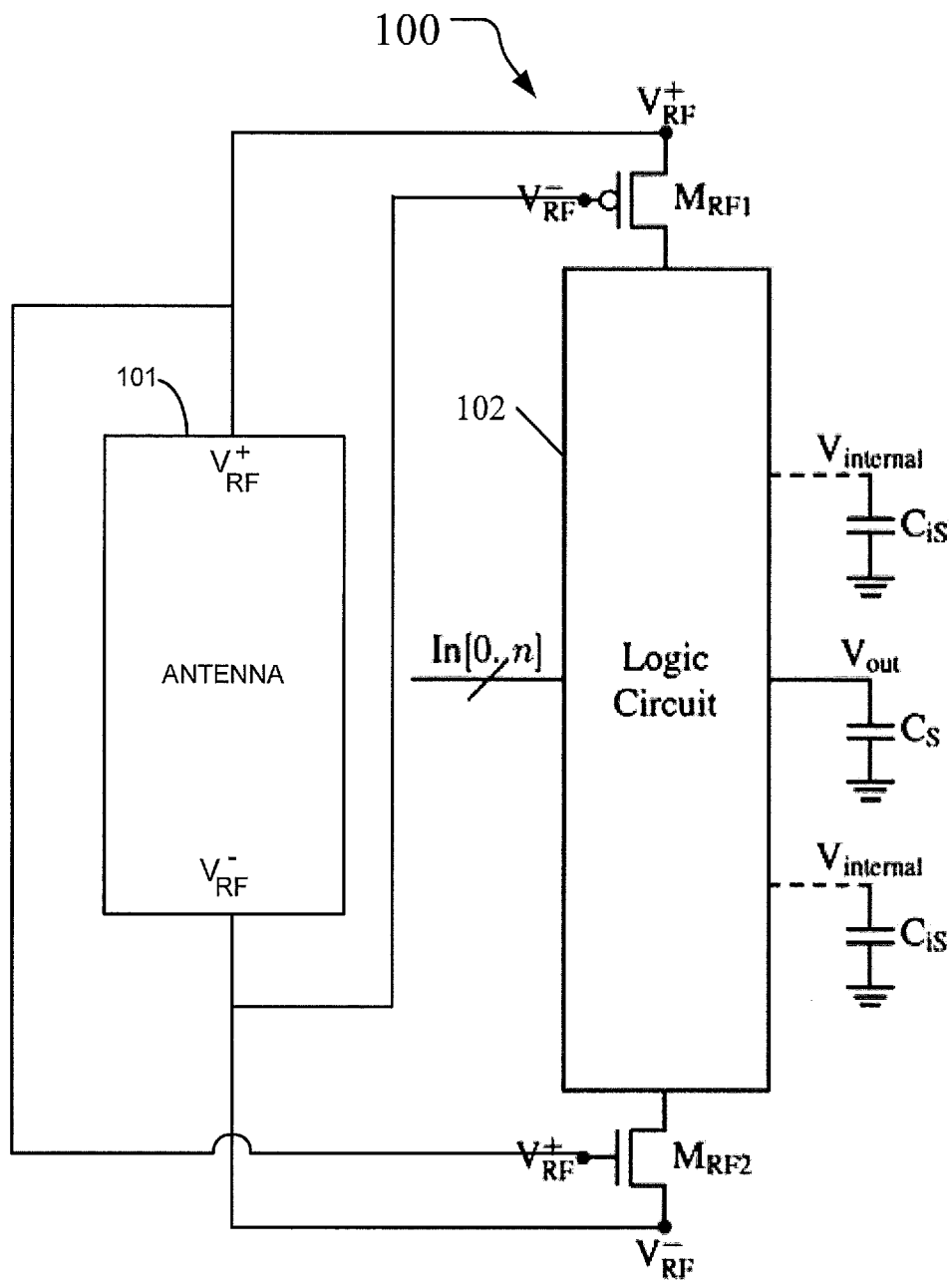
FIG. 1 is a block diagram illustrating a general configuration of an exemplary single-phase AC powered device according to an embodiment of the subject matter described herein.

FIG. 1 is a block diagram illustrating the general configuration of a single-phase AC powered device 100 according to an embodiment of the subject matter described herein. Device 100 includes a logic circuit 102 is powered by two anti-phase AC sources, VRF+ and VRF−, which are connected to logic circuit 100 through a pair of supply transistors MRF1 and MRF2. In the embodiment illustrated in FIG. 1, logic circuit 102 is connected to VRF+ through supply transistor MRF1 and connected to VRF− through supply transistor MRF2. The source terminal of supply transistor MRF1 is connected to VRF+ and the gate of supply transistor MRF1 is connected to VRF−. The source terminal of supply transistor MRF2 is connected to VRF− and the gate of supply transistor MRF2 is connected to VRF+.

In one embodiment, device 100 includes an antenna 101 for receiving AC signals, such as RF communications signals, where the antenna circuit is inductively powered and produces the two anti-phase RF sources VRF+ and VRF−. Logic circuit 102 includes one or more inputs, shown as In[0 . . . n] in FIG. 1, and one or more outputs. In the embodiment illustrated in FIG. 1, logic circuit 102 has one output Vout, to which is connected a storage capacitor Cs. FIG. 1 illustrates the principle that logic circuit 102 may have internal storage capacitors Cis that are connected to internal nodes with internal node voltages Vinternal.

The operation is as follows: when VRF+>VRF−, MRF1 and MRF2 are both strongly on, operating near threshold, supplying current to logic circuit 102. When VRF+<VRF−, these transistors are strongly off, minimizing leakage from the storage capacitors Cs and Cis. While the supply transistors are strongly off, the storage capacitors Cs and Cis hold the values of Vout and Vinternal until the next time that supply transistors MRF1 and MRF2 are again turned on. This configuration is referred to as "single phase" because the logic circuit is supplied with power only during one phase, where VRF+>VRF−, but not during the other phase, where VRF−>VRF+.

Capacitors Cs and Cis may be dedicated capacitor structures, parasitic node capacitance, or some combination of the two. Examples of parasitic node capacitance include, but are not limited to, MOSFET source and drain capacitance, wiring or interconnect capacitance, and other parasitic capacitances. The need for a dedicated capacitor structure may be obviated if the node capacitance is sufficient to maintain the node value during the time that the supply transistors are off and the capacitors lose charge through leakage.

Figure 2:
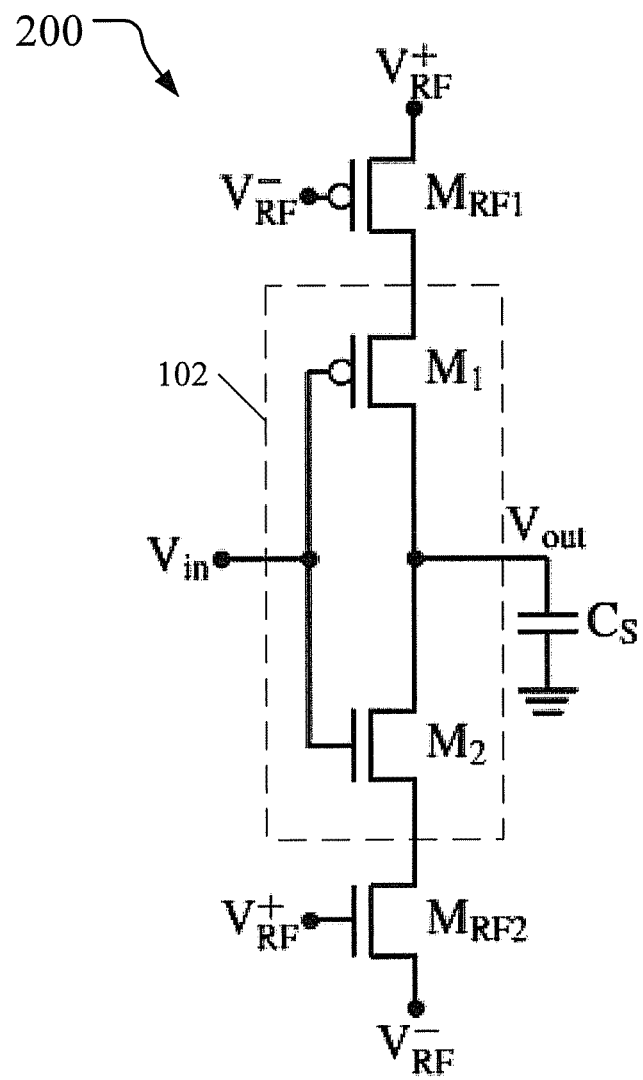
FIG. 2 is a circuit diagram showing details of an exemplary single-phase AC powered logic circuit according to an embodiment of the subject matter described herein.

FIG. 2 is a circuit diagram showing details of an exemplary single-phase AC powered logic circuit 200 according to an embodiment of the subject matter described herein. In the embodiment illustrated in FIG. 2, logic circuit 102 consists of a two-transistor inverter made up of PMOS transistor M1 and NMOS transistor M2. Input Vin is connected to the gates of M1 and M2, and the drains of M1 and M2 are connected together to create output Vout. Storage capacitor Cs holds the value of Vout while supply transistors MRF1 and MRF2 are off.

In this manner, supply transistors MRF1 and MRF2 are used to reduce the leakage in the circuits while the power rails are inverted and the circuit is off. The output node has a storage capacitor, which holds the output voltage stable during the off periods of the circuit. Internal nodes of the logic circuits can optionally have small storage capacitors to slow the leakage from the internal nodes, which reduces the amount of fluctuation on those nodes.

In one embodiment, single-phase circuits can be alternated or cascaded to evenly utilize the phases of the RF source. For example, an the first inverter in a chain of inverters may be connected to VRF+ at the top of the circuit and to VRF− at the bottom, while the next inverter in the chain may be connected to VRF− a the top of the circuit and to VRF+ at the bottom. If more phases are available, such as a quad phase source, cascading single or dual phase circuits is possible to evenly utilize the source.

Figure 3:
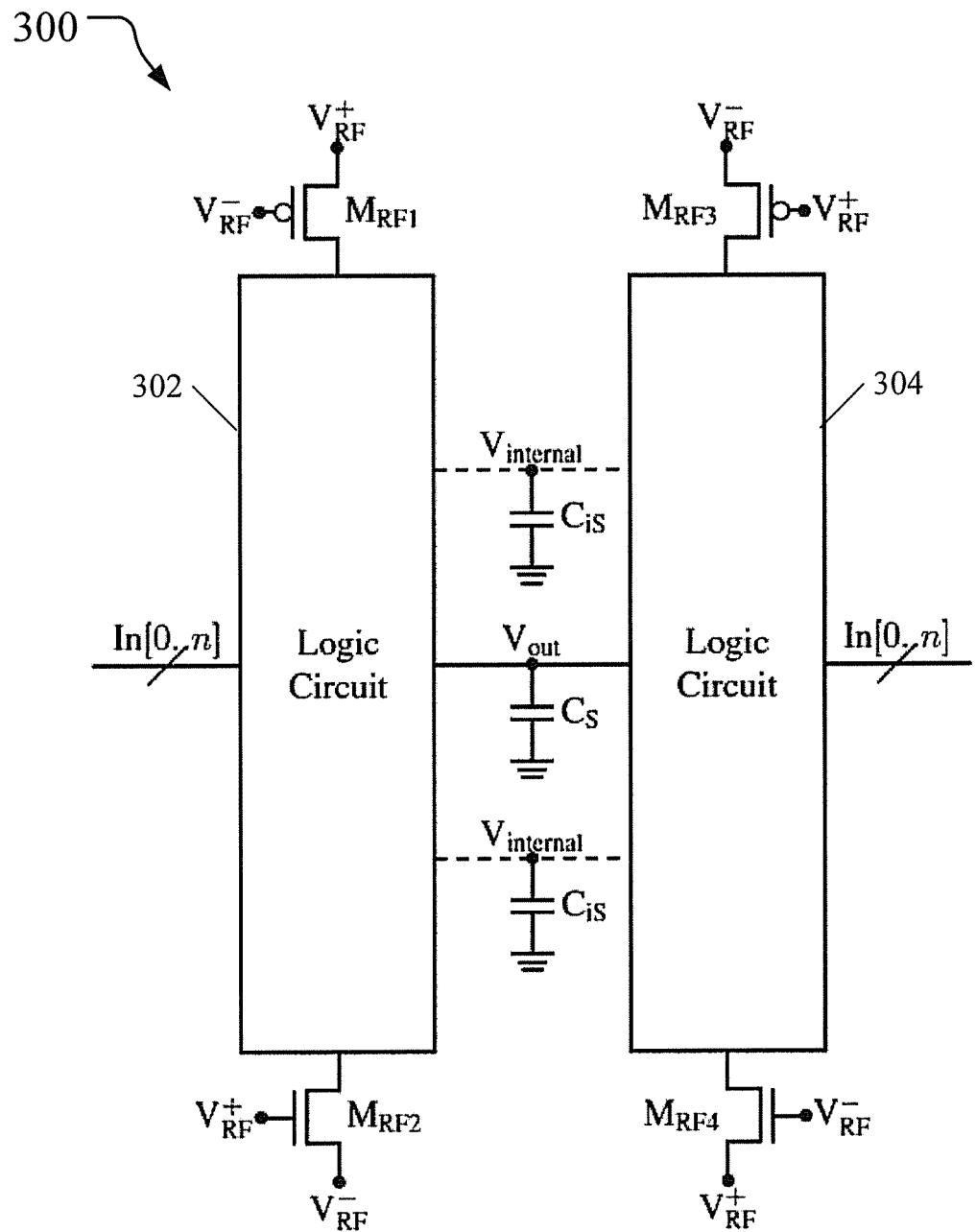
FIG. 3 is a block diagram illustrating a general configuration of an exemplary dual-phase AC powered device according to an embodiment of the subject matter described herein.

FIG. 3 is a block diagram illustrating a general configuration of an exemplary dual-phase AC powered device 300 according to an embodiment of the subject matter described herein. Device 300 includes a pair of logic circuits 302 and 304, which are powered by opposite phases. The connection of the RF supplies in the right hand circuit is reversed, so as to keep the stored value valid in the opposing phase and allowing the circuit to continue evaluating the logic function. Cs has to be large enough to store the required logic value during the time when the difference between VRF+ and VRF− is too small to power either logic circuit and thus neither circuit is driving the node, which is herein referred to as "Toff".

In the embodiment illustrated in FIG. 3, logic circuit 302 receives power when supply transistors MRF1 and MRF2 are on, i.e., when VRF+ is greater than VRF−, while logic circuit 304 receives power when supply transistors MRF3 and MRF4 are on, i.e., when VRF+ is less than VRF−. Supply transistors MRF1 and MRF2 are on when supply transistors MRF3 and MRF4 are off, and vice versa. Thus, when logic circuit 302 operates, logic circuit 304 does not, and vice versa. Note that logic circuits 302 and 304 receive the same input signals and that their outputs are connected together. In one embodiment, logic circuits 302 and 304 are duplicates of each other, but other configurations are also contemplated, such as when it is desired that the output Vout vary with the phase of the supplies VRF+ and VRF−. Voltages at internal nodes (Vinternal) may be maintained by internal storage capacitors Cis, which may be capacitor structures or may represent transistor source/drain capacitance or other parasitic capacitance in the circuit.

Figure 4:
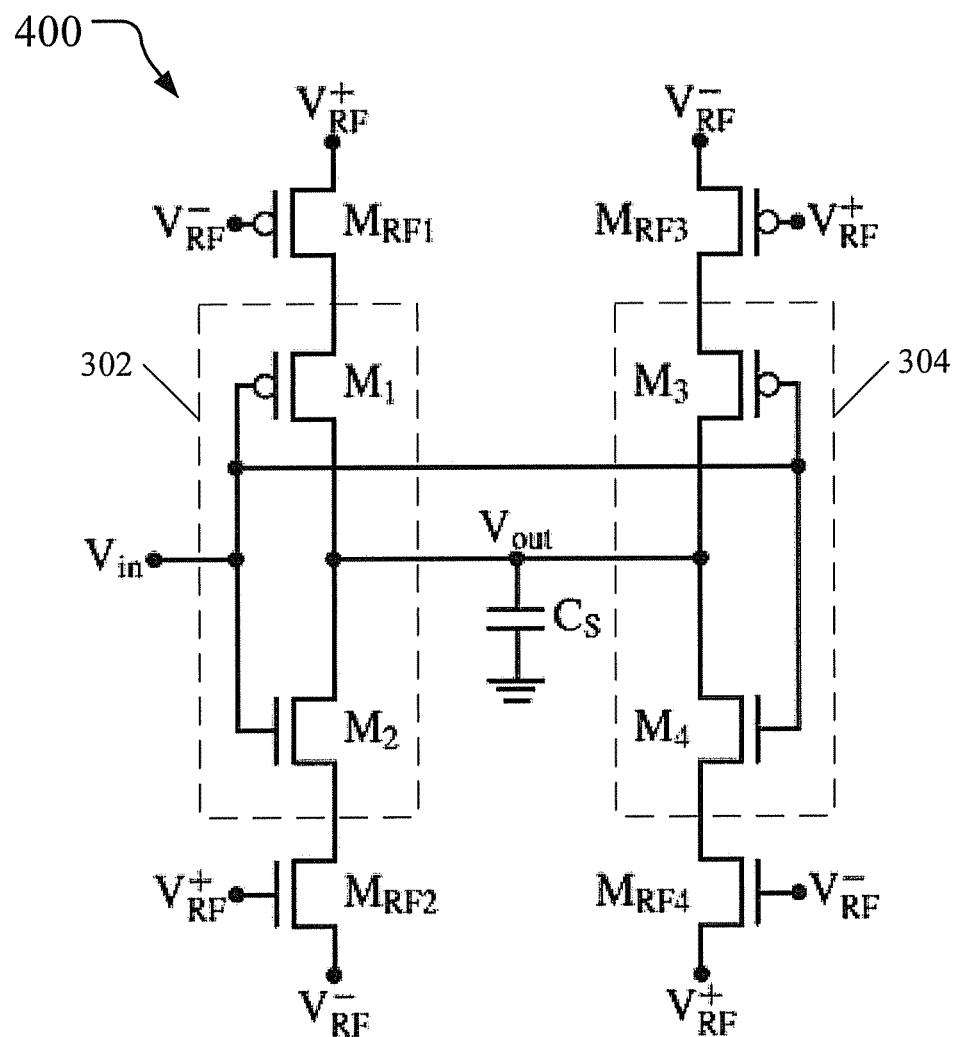
FIG. 4 is a circuit diagram showing details of an exemplary dual-phase AC powered logic circuit according to an embodiment of the subject matter described herein.

FIG. 4 is a circuit diagram showing details of an exemplary dual-phase AC powered logic circuit 400 according to an embodiment of the subject matter described herein. In the embodiment illustrated in FIG. 4, logic circuits 302 and 304 are shown in detail. Each logic circuit 302 and 304 is an inverter, where transistors M1 and M2 are one inverter and transistors M3 and M4 are the other inverter. The two inverters are connected in parallel, with Vin connected to their inputs and Vout connected to their outputs. Logic circuit 302 is connected to VRF+ via MRF1 and to VRF− via MRF2. Logic circuit 304 is connected to VRF− via MRF3 and to VRF+ via MRF4. Storage capacitor Cs holds the value of Vout. In the embodiment illustrated in FIG. 4, transistors M1-M4 are sized such that their channel resistances are equivalent to each other and that the channel resistance ($R_{CHANNEL}$)×capacitance Cs has a time constant greater than Toff, which prevents the storage capacitor Cs from losing its data while the circuit is off and leaking. The operation of logic circuit 400 is shown in FIG. 5.

Figure 5:
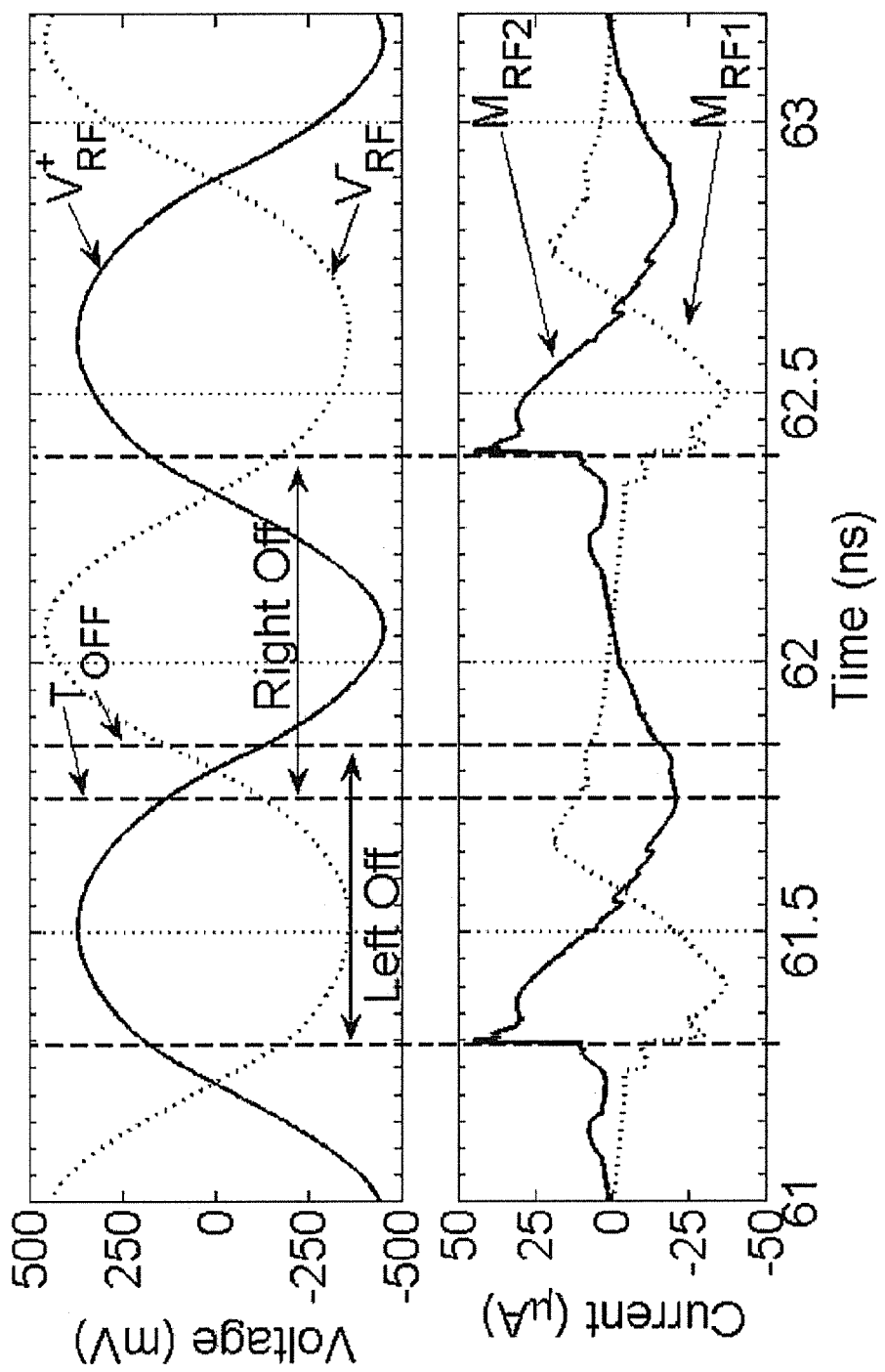
FIG. 5 is a graph showing voltages and currents during operation of an exemplary AC powered logic circuit according to an embodiment of the subject matter described herein.

FIG. 5 is a graph showing voltages and currents during operation of an exemplary AC powered logic circuit according to an embodiment of the subject matter described herein. FIG. 5 shows simulated voltages of supplies VRF+ and VRF−, displayed in the top half of FIG. 5, and simulated current through supply transistors MRF1 and MRF2, displayed in the bottom half of FIG. 5, demonstrating the operation of logic circuit 400. Starting at time 61.3 ns, VRF+ is approximately 200 mV and VRF− is approximately −200 mV. Thus the gate to source voltage ($V_{GS}$) of NMOS transistor MRF2 is 400 mV, which is enough to turn it on. Likewise, $V_{GS}$ of PMOS transistor MRF1 is −400 mV, which is enough to turn it on also.

This is reflected in the current graph, which shows a sharp spike in current through MRF1 and MRF2, respectively. At time 61.75 ns, VRF+ drops below 200 mV and VRF− goes above −200 mV, at which time MRF1 and MRF2 turn off. MRF3 and MRF4 are also, and so the period referred to as "Toff" starts at this time. Toff ends at 61.85 ns, when $V_{GS}$ of NMOS transistor MRF4 is 400 mV and $V_{GS}$ of PMOS transistor MRF3 is −400 mV, causing them both to turn on. Both MRF3 and MRF4 will turn off again at approximately 62.3 ns, starting another Toff period that ends at approximately 62.4 ns. Thus, during the positive phase, when VRF+ is greater than VRF−, the supply transistors are on and contributing to the operation of the circuit and during the dead time, while the complementary circuit is operating, the left side of the circuit is leaking charge from the capacitor.

Operating directly from an AC/RF source without rectifying the source first allows for operation below the practical limits of rectifying circuits. The AC circuits described herein allow standard digital logic blocks, such as CMOS and pass-gate logic, to be implemented inside an application that uses AC- or RF-power harvesting, without much modification to the original logic circuit topologies. The circuits can either use a dual or single-phase power source, depending on the speed, power, and space requirements.

Because there are no circuits between the digital circuits and the RF source, the digital circuits can operate at a RMS voltage comparable to standard DC powered CMOS sub-threshold circuits (150+mV). Since the RF rails will not be stable, in one embodiment each circuit may include its own storage device to preserve the partial computation between appropriate phases. Since the RF source will usually be at a frequency higher than the data rate, a power-on-reset circuit may be impractical, in which case a partial data storage device may be needed. In one embodiment, the parasitic capacitance of the supply transistors or the logic circuit transistors may be sufficient to maintain the voltages on internal nodes. Alternatively, a separate storage device, such as a capacitor, may be placed on some or all of the internal nodes of the circuit.

AC powered logic circuits according to embodiments of the subject matter described herein have been implemented using MIT Lincoln Laboratory's subthreshold optimized process with five basic logic gates, including an inverter, a NAND, a pass-gate XOR, a 2-1 multiplexer, and a C2MOS flip-flop. These gates were chosen to demonstrate the utility of AC powered logic circuits and could become a basic set of gates that could utilized in a standard cell library.

Figure 6:
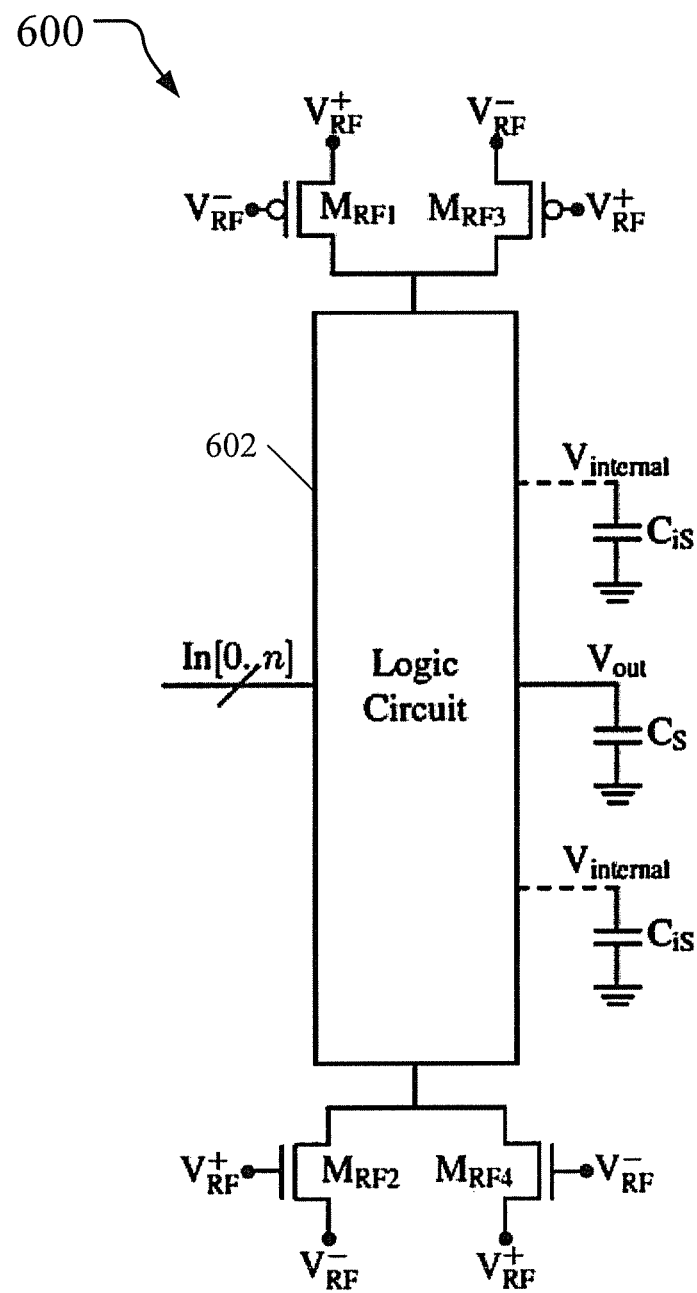
FIG. 6 is a circuit diagram illustrating a general configuration of an exemplary dual-phase AC powered logic circuit according to another embodiment of the subject matter described herein.

FIG. 6 is a circuit diagram a general configuration of an exemplary dual-phase AC powered logic circuit 600 according to another embodiment of the subject matter described herein. In the embodiment illustrated in FIG. 6, supply transistors MRF1 and MRF2 are active during one phase of the AC supplies VRF+ and VRF−, while MRF3 and MRF4 are active during the opposite phase of VRF+ and VRF−. In this manner, the logic circuit 602 is supplied with power during both phases of the AC supply. The same principle may be applied to AC supplies having more than two phases, e.g., a supply transistor or set of supply transistors per phase.

Figure 7:
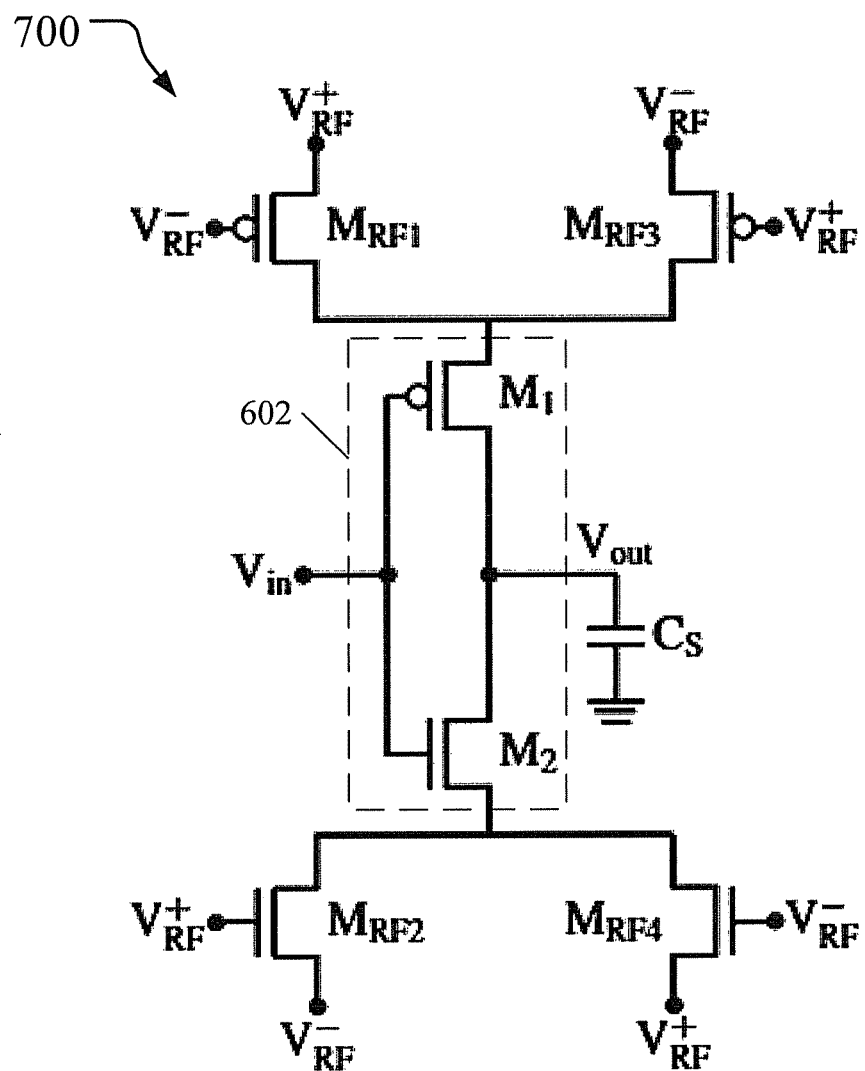
FIG. 7 is a circuit diagram showing details of an exemplary dual-phase AC powered logic circuit according to another embodiment of the subject matter described herein.

FIG. 7 is a circuit diagram showing details of an exemplary dual-phase AC powered logic circuit 700 according to another embodiment of the subject matter described herein. The embodiment illustrated in FIG. 7 illustrates another dual-phase configuration in which a CMOS inverter made up of transistors M1 and M2 are supplied by a pair of supply transistors at each end, where each pair operates in opposite phase from each other. In FIG. 7, for example, supply transistors MRF1 and MRF2 are active during one phase of the AC supplies VRF+ and VRF−, while MRF3 and MRF4 are active during the opposite phase of VRF+ and VRF−. In this manner, the inverter is supplied with power during both phases of the AC supply.

Figure 8:
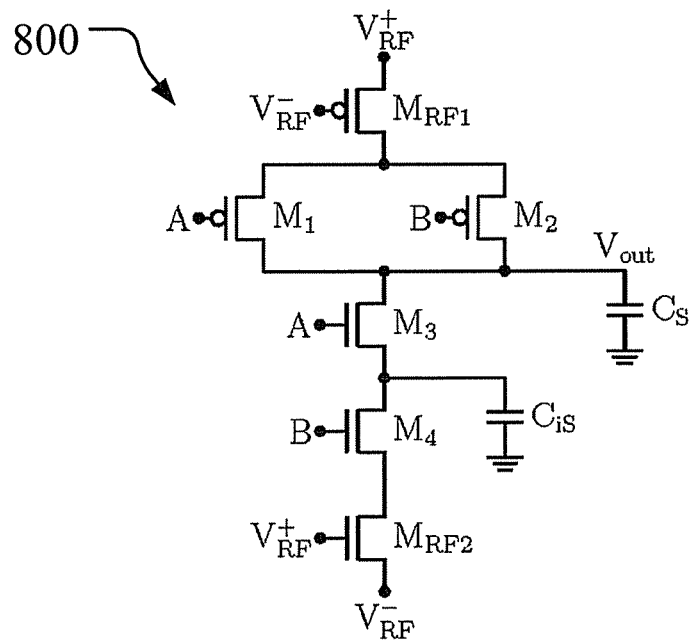
FIG. 8 is a circuit diagram of an exemplary NAND circuit according an embodiment of the subject matter described herein.
Figure 9:
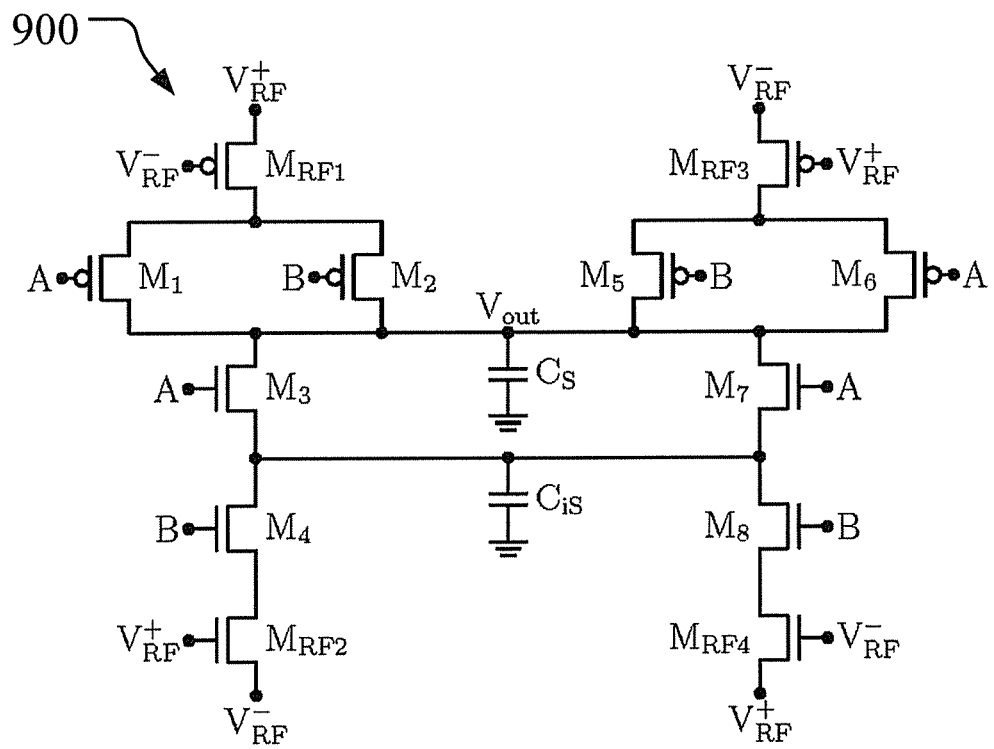
FIG. 9 is a circuit diagram of an exemplary NAND circuit according to another embodiment of the subject matter described herein.

FIGS. 8 and 9 are circuit diagrams illustrating exemplary NAND circuits according to embodiments of the subject matter described herein. FIG. 8 illustrates a single-phase NAND 800. In FIG. 8, the transistors M1-M4 form a traditional CMOS NAND structure, which is connected to AC/RF sources by supply transistors MRF1 and MRF2. The output of the NAND, Vout, is connected to a storage capacitor Cs. In the embodiment illustrated in FIG. 8, an additional internal storage capacitor, Cis, is also present to store the voltage at the internal node between NMOS transistors M3 and M4.

FIG. 9 illustrates a dual-phase NAND 900 according to an embodiment of the subject matter described herein. In the embodiment illustrated in FIG. 9, transistors M1-M4 form a first traditional CMOS NAND structure that is connected to AC/RF sources by supply transistors MRF1 and MRF2 such that is it active when VRF+ is greater than VRF−, while transistors M5-M8 form a second traditional CMOS NAND structure that is connected to the AC/RF sources by supply transistors MRF3 and MRF4 such that it is active when VRF+ is less than VRF−. In this manner, the first NAND is active during one phase of the AC sources and the second NAND is active during the opposite phase of the AC sources. The outputs of both NANDS are connected together to produce Vout, and the internal nodes are also connected together. In the embodiment illustrated in FIG. 9, a storage capacitor Cs is present at Vout and an internal storage capacitor Cis is present at the node that is common to M3, M4, M7, and M8.

Figure 10:
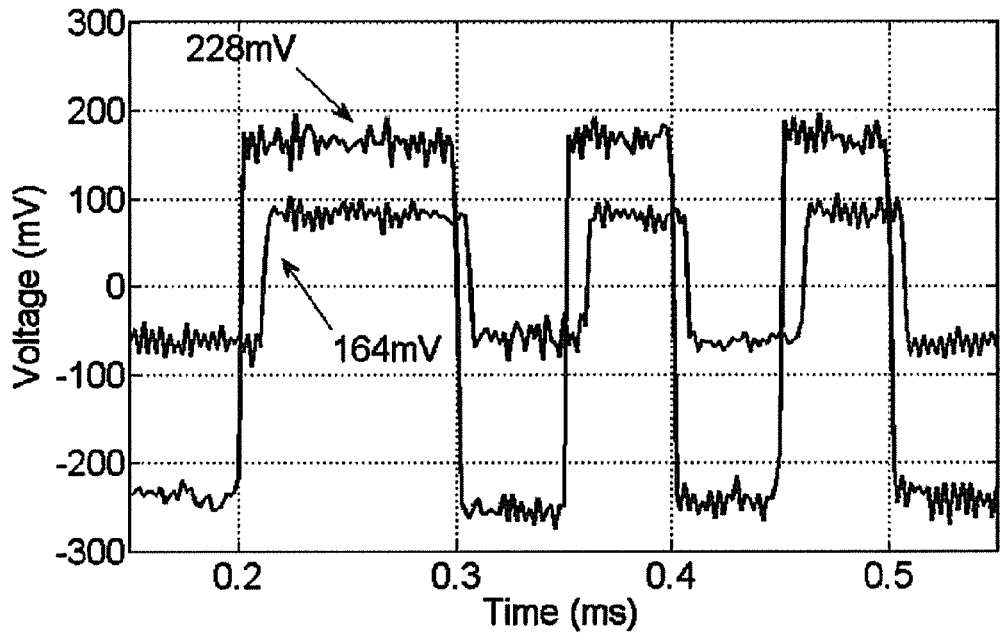
FIG. 10 is a graph of a measured waveform of an exemplary 2-1 MUX according to an embodiment of the subject matter described herein.

FIG. 10 is a graph of a measured waveform of an exemplary 2-1 MUX designed according to the principles described herein and operating at two different RF RMS voltages of 228 mV and 164 mV. With a bit rate of 2 kb/s, correct operation up to 642 mV has been verified. This demonstrates the operation of the circuit at a range of operating voltage levels, which would allow a potential sensor to be placed at a range of distances from the power source without incurring an operation penalty.

These AC powered logic circuits have a significant advantage over a normal DC supplied sub-threshold circuit, in that they have potential for even lower voltage operation than the latter. In the latter, drain voltage ($V_{DD}$) is limited by the ratio of the on-current ($I_{ON}$) to the off-current ($I_{OFF}$) in the two different voltage states, which is related to the range of $V_{GS}$. $V_{GS}$ normally ranges from 0V to $V_{DD}$. When driven by $V_{DD}$, the transistor is charging the parasitic capacitors, via a sub-threshold current $I_{ON}$. When driven by 0V, the transistor is discharging the capacitors by the off current $I_{OFF}$. Since $I_{OFF}$ is often on longer than $I_{ON}$, this ratio determines the how well the circuit operates. The ratio of $I_{ON}$ to $I_{OFF}$ increases exponentially with the range of $V_{GS}$. With the AC circuits described herein, the outer transistors are turned on and off with twice the effective voltage as in normal DC sub-threshold transistors. The ratio between $I_{ON}$ and $I_{OFF}$ also decreases with the threshold voltage ($V_T$). Thus one indirect advantage of the circuits proposed here are that $V_T$ can be lowered, permitting lower operating voltage. For unattended power harvesting, the battery life would be very long (basically the shelf life), since the load is just to bias the substrate.

One of the limitations with ultra-low voltage circuits is the limited swing of the output of the gates. Since the output node voltage carries a portion of the RF signal, the ripple formed by this limits the minimum swing, along with the circuits' ability to drive the fan-out. Another limitation to the minimum operating voltage is the height of the gate stack; utilizing smaller fan-in circuits and other topologies, such as pass-gate logic, could mitigate this.

Figure 11:
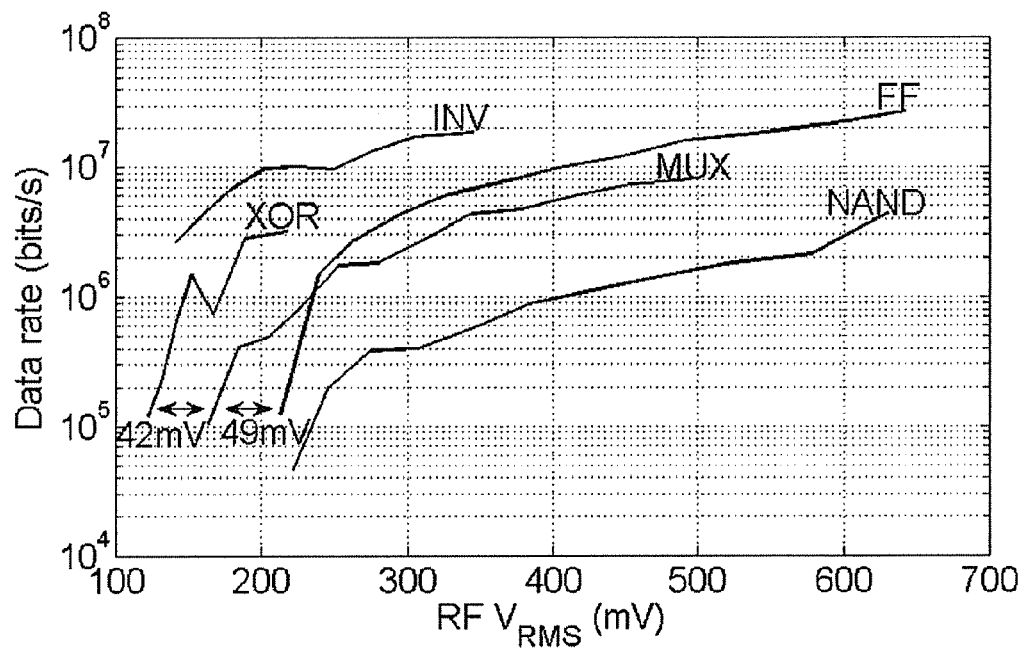
FIG. 11 is a graph showing the maximum bit rate versus the applied RMS voltage for five different circuits designed according to embodiments of the subject matter described herein.

FIG. 11 is a graph showing the maximum bit rate of the five individual circuits versus the applied RMS voltage. FIG. 11 shows maximum bit rate versus RF $V_{RMS}$ for an inverter (INV), an exclusive or (XOR), a multiplexer (MUX), a flip-flop (FF), and a NAND. Circuits that use these components would be limited to the lowest performing circuit, which in this case would be the flip-flop and would limit the operation to a minimum voltage level of 210 mV with a bit rate of 125 kb/s. However, to improve the minimum operating voltage a different logic topology could be utilized that would reduce the transistor stack, such as using a true single phase clock (TSPC) or transmission gate (TG). FIG. 11 demonstrates the effect that the height of the transistor stack has on the performance of AC powered logic circuits according to the subject matter described herein. For a given data rate, the height of the transistor stack limits the minimum operating voltage. Referring to FIG. 11, for example, comparing the minimum voltage of the FF and MUX, which is the equivalent of removing one transistor from the stack, reduces the minimum voltage by 49 mV, and removing another transistor, such as in the case of the XOR, the minimum is further reduced by 42 mV. Measurements show this would reduce the operating limit 164 mV and a data rate of 105 kb/s based on the MUX performance. By changing to a pass-gate topology, such as the XOR, the operating limit is reduced to 122 mV with a similar data rate.

The AC powered logic circuits described herein have additional advantages over conventional approaches, including:

Low operating voltage: Lowest voltage operation is only limited by the stacking of transistors, similarly to DC logic circuits, not the efficiency of the rectifying circuits. There is potential to drive the operating voltage down further by biasing the transistors to have a low threshold voltage.

Since the transistors are driven strongly off when turned off, the normal tradeoff with leakage power is not a big issue.

Wide voltage range of operation: Circuits can operate safely from subthreshold operation to normal voltage operation without any need to consider the voltage levels.

Wide frequency range of operation: Circuits can easily be designed to be powered over a large range of source frequencies.

No rectification required: Rectification is performed internally in the logic circuits on the data only. Therefore there is no need to implement RF-DC/AC-DC conversion circuits to supply power to the circuits.

Standard logic circuits: Standard logic circuits can be put directly into the RF-only construct, without the need to change the circuit topology.

No power-on-reset circuits: There is no need for special circuitry to detect low voltage conditions since all the circuits store their own data for the off period. This also allows the data clock to be slower than the source frequency.

High source frequency/low data rate or low source frequency/high data rate: Circuits can either work with a higher source frequency than the data rate or a lower source frequency than the data rate.

Yet another advantage of the AC powered logic circuits described herein is that conventional static CMOS circuits can be used in the core, in between the supply transistors connected to AC sources. An advantage of CMOS circuits is that they are relatively robust.

The AC powered circuits described herein have characteristics that make them particularly suitable for use in RF powered applications. The voltage reduction compared to conventional diode rectifiers leads to a substantial improvement in sensitivity and thus harvestable RF range. In the case of an omnidirectional radiating source, the harvestable power increases with $R^4$ where distance R is the distance from the source. Since power into a fixed impedance varies as $V^2$, the harvestable distance increases with $\sqrt{V}$. By moving from a circuit requiring a 300 mV to a 60 mV AC signal, for example, the harvestable range increases by 2.2×. The increased sensitivity allows RFID devices, for example, to be read at larger relative angles of the antennae. In some instances, this increased sensitivity may obviate the need for multiple readers and may thus reduce total system costs. Passive RFID devices must be manufactured at a very low cost, which means that chip area becomes a cost constraint. The AC powered circuit techniques presented herein consume very little chip area compared to conventional techniques.

The AC powered logic circuits described herein may be implemented or enhanced by a number of complimentary techniques. Some of these techniques will now be discussed.

In one embodiment, pass-gate circuits can be incorporated to further reduce the required operating voltage and power consumption. Rules could be generated to guarantee robustness while incorporating pass gates, which could be implemented as single device pass gates, such as NFETs, or dual device pass gate structures, such as CMOS. One advantage to using an NFET structure is that it is possible to bias the body during operation so as to reduce the $V_T$ drop while determining the logical driving of the storage node.

In another embodiment, the logic circuits may be implemented using NFETs with resistive pull-ups. While this would reduce the power efficiency, due to the through currents, this through current is only present in a single phase and, by reducing the transistor stack, has the potential to reduce the required AC operating voltage.

Figure 12:
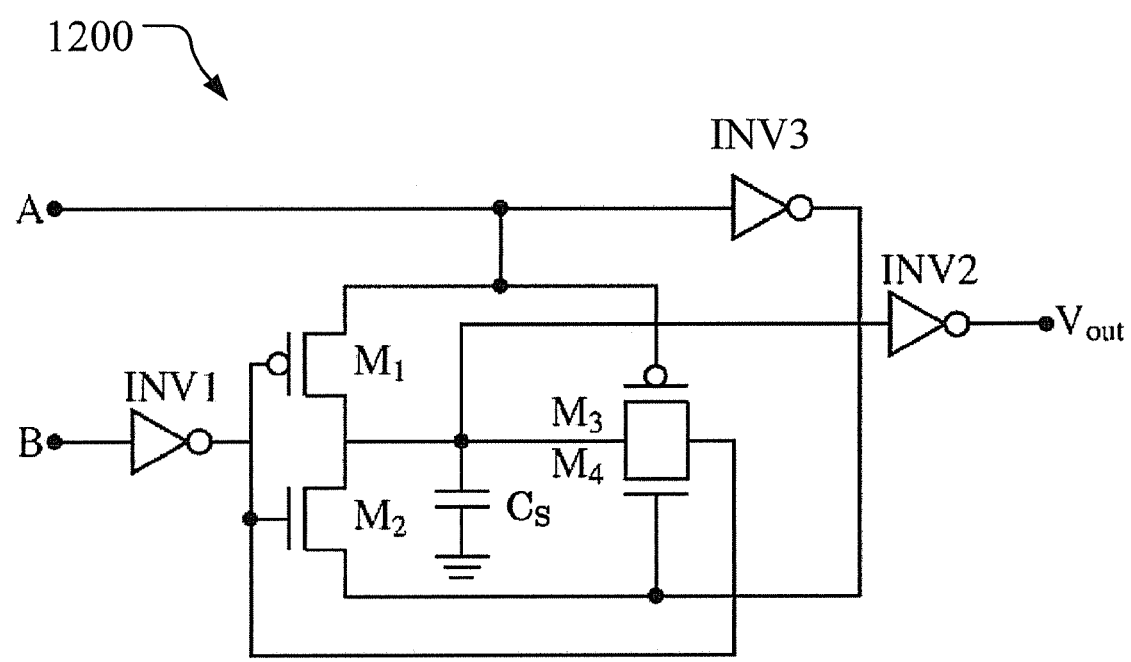
FIG. 12 is a circuit diagram illustrating an exemplary pass-gate circuit according to an embodiment of the subject matter described herein.

FIG. 12 is a circuit diagram illustrating an exemplary pass-gate circuit 1200 according to an embodiment of the subject matter described herein. The exclusive or (XOR) circuit illustrated in FIG. 12 has two inputs, A and B, and an output Vout. Transistors M1 and M2 form an inverter, which drives the transmission gate formed by transistors M3 and M4. Input A provides power to the top of the inverter formed by transistors M1 and M2 and to inverter INV3, which provides power to the bottom of the inverter formed by transistors M1 and M2. Input B drives the inverter formed by transistors M1 and M2. When input A is high, the inverter formed by M1 and M2 is active, driving Vout via inverter INV2, and the transmission gate is closed. When input A is low, the inverter formed by M1 and M2 is off and the transmission gate is open, allowing inverter INV1 to drive Vout via inverter INV2. In other words, when A is high, Vout=B', and when A is low, Vout=B. In the embodiment illustrated in FIG. 12, an internal storage capacitor Cs is used to store the intermediate value while the circuit is inactive. Robustness is ensured by the isolating transistors INV1 and INV2. Note that the tallest gate stack between supplies is only 2 transistors high. This ensures low voltage operation. In contrast a conventional fully static XOR gate would be 4 transistors high, thus requiring a higher operating voltage. The XOR illustrated in FIG. 12 could be implemented using single or dual phase pass gates as well as using single or dual phase complementary implementation styles.

In one embodiment, an AC powered logic circuit may use Schmitt triggers, which would improve the noise margin and thus permit lower operating voltages.

In one embodiment, the size of the storage capacitors required to store the node voltages during Toff is to reduce the duration of Toff. One method includes deliberately skewing the gate and source AC voltages in the circuit. If the source voltage is retarded with respect to the gate voltage then the "dead time" when nether logic gate is charging Cs is reduced.

In one embodiment, a resonant tank circuit, such as an LC tank, could be utilized to store excess charge from the antenna circuit and amplify the AC signal. The key to successful AC storage is to minimize the transfer resistance between the inductor and capacitor, including internal resistance. Of course, this approach is only useful at a specific AC frequency, though trim capacitors might be incorporated to allow precise tuning of the resonance. However, even a low-loss resonant circuit will quickly lose its charge. Its main utility would be to increase the time during which a circuit could be powered after leaving the region of high RF charging.

In one embodiment, a chain of inverters can be configured as a ring oscillator to enable a clock, or set of clocks to be generated, so as to permit synchronous logic design. The clock(s) could be synchronized to an external signal by using the comparator described below and a phase shift control circuit connected into the inverters.

Figure 13:
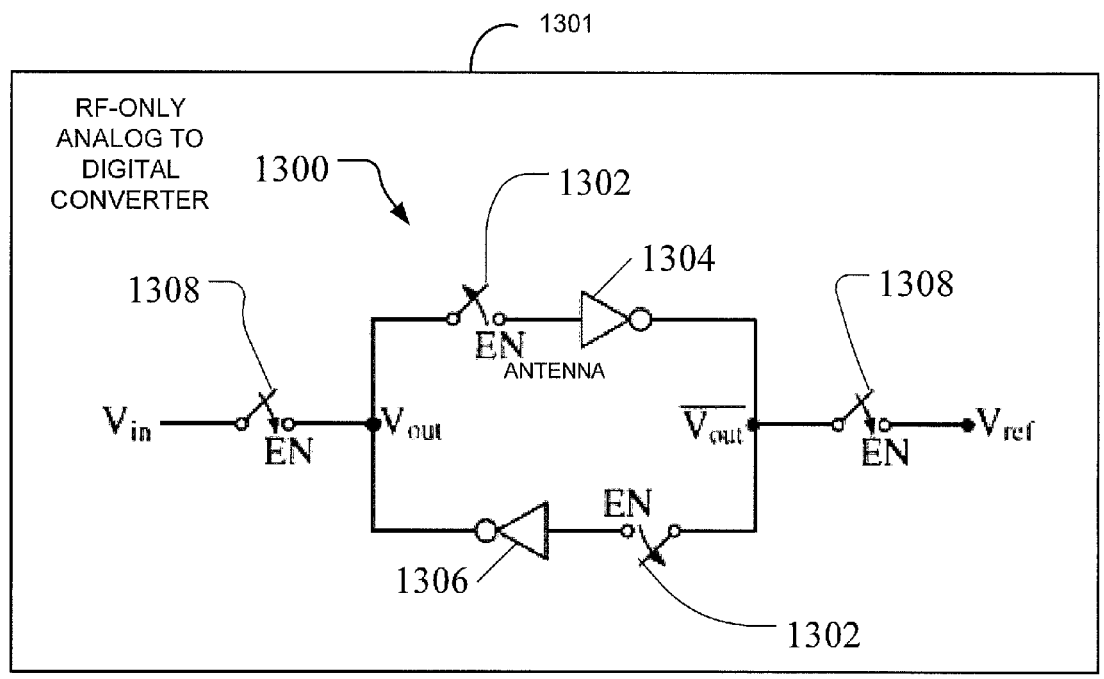
FIG. 13 is a circuit diagram illustrating an exemplary comparator according to an embodiment of the subject matter described herein.

FIG. 13 is a circuit diagram illustrating an exemplary comparator 1300 according to an embodiment of the subject matter described herein. In one embodiment, an RF-only analog to digital converter 1301 can be implemented as a successive approximation architecture using an R-2 R ladder digital to analog converter and the comparator illustrated in FIG. 13. Comparator 1300 works by sampling the two inputs Vin and Vref while enable signal EN is active, which causes switches 1302 to open and during which cross-coupled AC powered inverters 1304 and 1306 are disconnected from each other to allow the voltages to be sampled onto the storage capacitors internal to the inverters. When EN changes phase the sampling is done; switches 1302 close and switches 1308 open, causing the inputs Vin and Vref to be disconnected and causing cross-coupled inverters 1304 and 1306 to be connected, which allows them to amplify the difference between Vin and Vref. Vout will be high if Vin>Vref and Vout will be low if Vin<Vref. In one embodiment, inverters 1304 and 1306 may be implemented using either the single or dual phase AC powered inverters shown in FIGS. 2 and 4, respectively, and the switches may be implemented using standard transmission gates.

The AC powered circuits described herein are particularly suitable for RF power harvesting devices, such as RFID tags. One communication scheme that is suited for these types of circuits is a backscattering based solution. However, if all the circuits are using the antenna for power, it would be undesirable to use the RF power antenna for the communications, especially where backscatter commutations which would short the power rails together during transmission and potentially delete the state of the circuits. Thus, in one embodiment, a second antenna may be provided for communication, as shown in FIG. 14.

Figure 14:
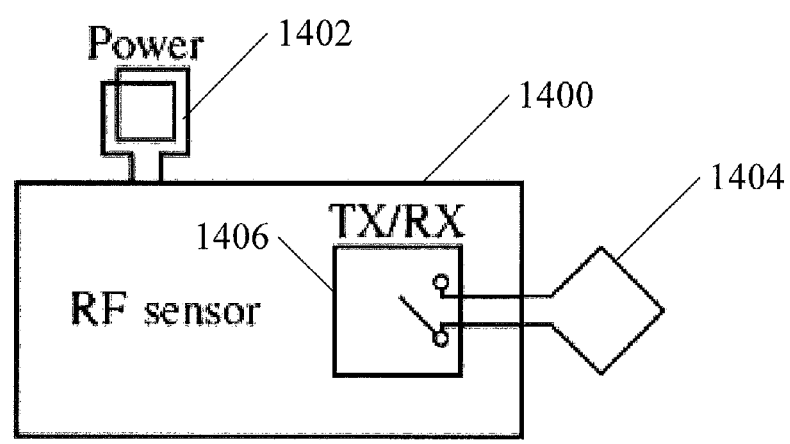
FIG. 14 is a block diagram illustrating an exemplary device using AC powered logic circuits according to an embodiment of the subject matter described herein.

FIG. 14 is a block diagram illustrating an exemplary device using AC powered logic circuits according to an embodiment of the subject matter described herein. In the embodiment illustrated in FIG. 14, RF sensor 1400 has a first antenna 1402 for harvesting power to supply the logic circuits within the device and a second antenna 1404 for communication between sensor 1400 and external devices such as readers, etc. Second antenna 1404 is used by a transceiver circuit 1406 and will be interrogated externally to enable the communications and backscatter the data. In one embodiment, second antenna 1404 is designed to operate in a different frequency band than the frequency band being harvested from and will have less stringent requirements on its design since it is only intended to convey data. Second antenna 1404 can thus be safely shorted for the backscattering communications without affecting the operation of sensor 1400.

In one embodiment, rather than using backscattering communications, a device may amplitude modulate a signal to transmit on the same frequency as the incoming RF by using the internal transistors as modulators onto an antenna. Alternatively, the outer transistors can be fed by sinusoidal clocks, as generated above to build an AM transmitter operating at a different speed.

Figure 14A:
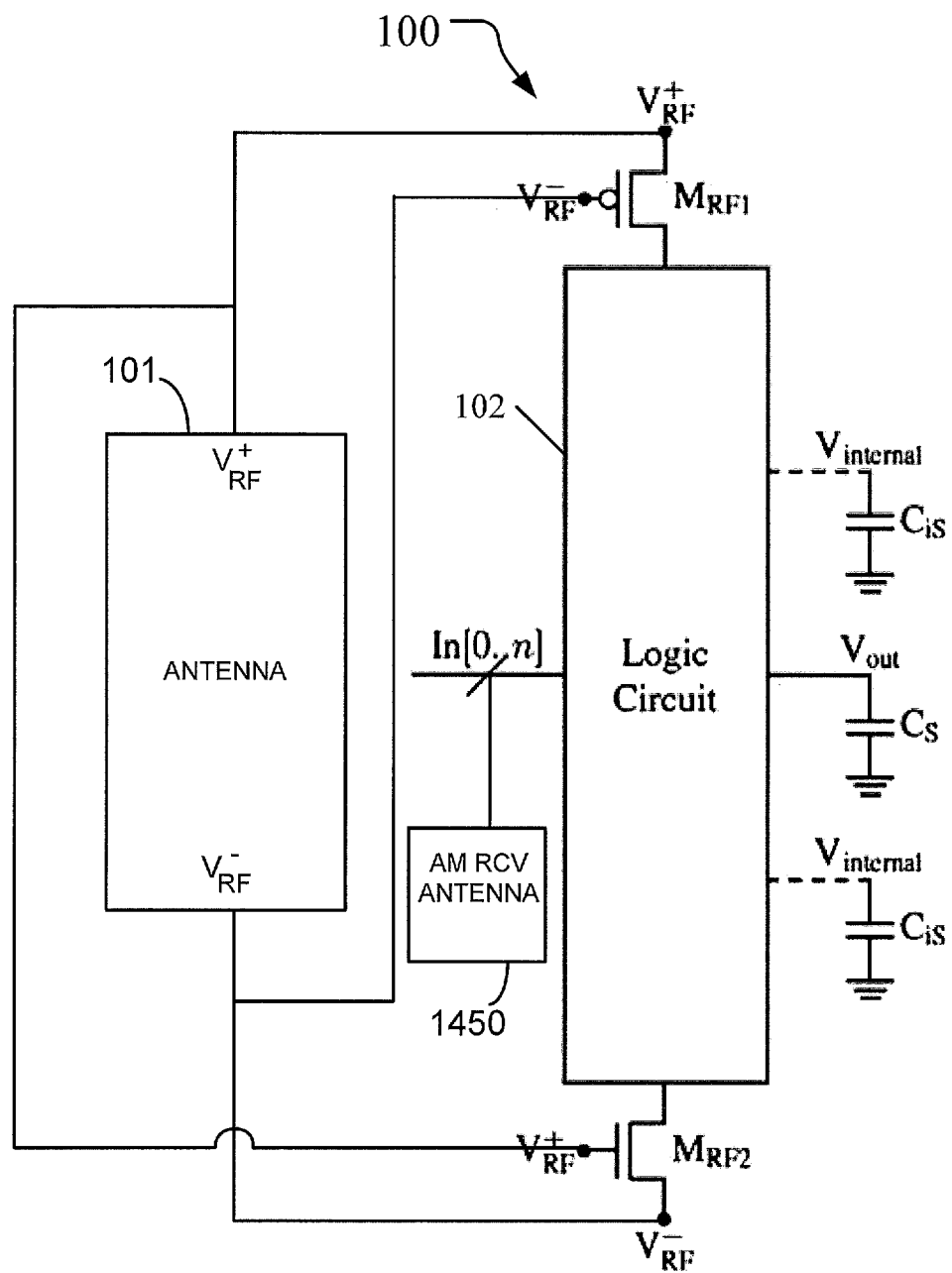
FIG. 14A is a block diagram illustrating an AM receiver using an AC powered logic circuit according to an embodiment of the subject matter described herein.

In one embodiment, as illustrated in FIG. 14A, by using a separate antenna 1450 tuned to a different frequency, and circuits similar to those described above, an amplitude modulated RF receiver could be built. The separate signal could be used to generate "on" and "off" signals either by using the outer transistors or the inner transistors.

Figure 14B:
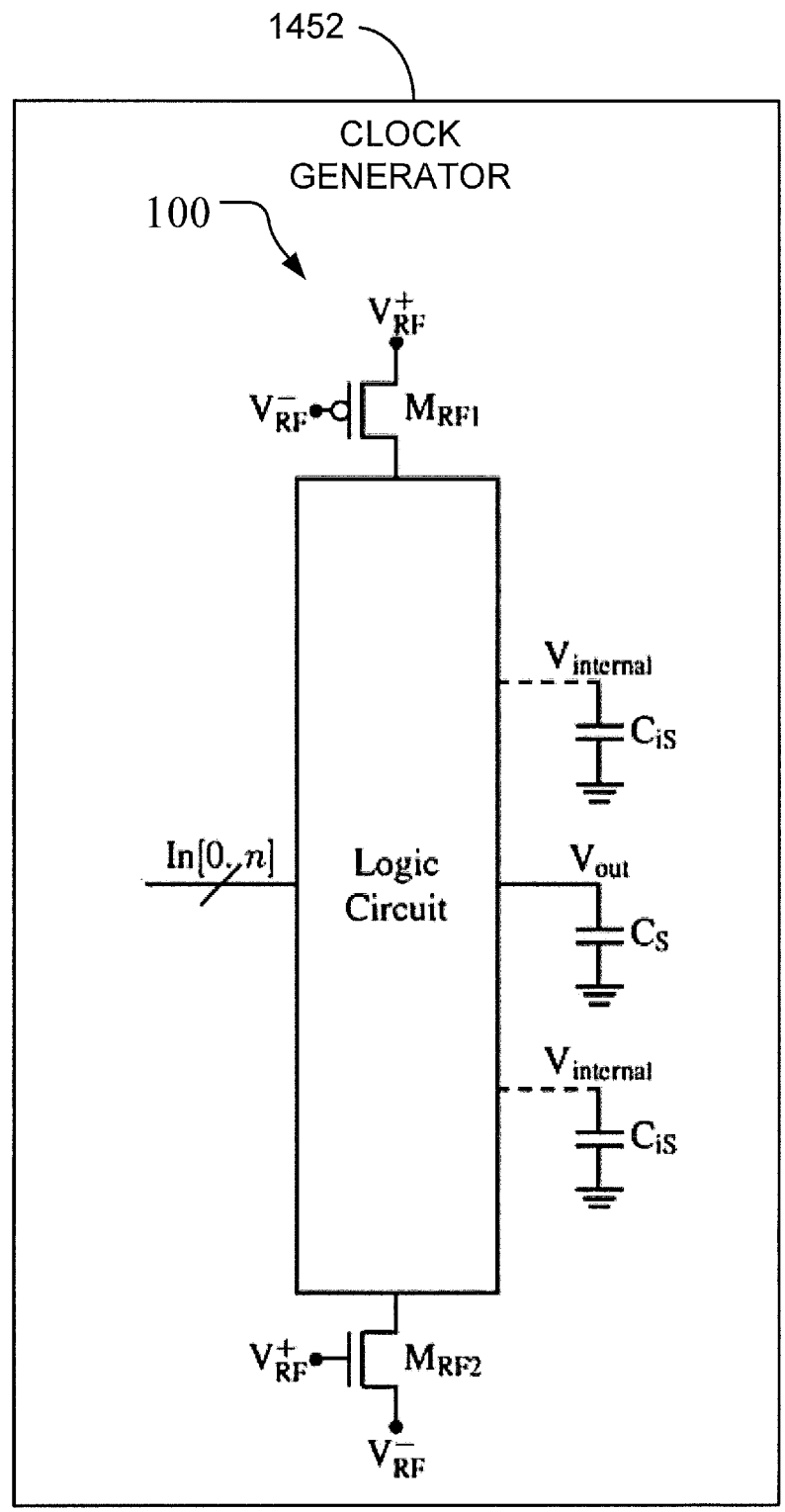
FIG. 14B is a block diagram illustrating a clock generator including an AC powered logic circuit according to an embodiment of the subject matter described herein.

In another embodiment of the subject matter described herein, logic circuit 102 and transistors MRF1 and MRF2 may be components of a clock generator 1452, as illustrated in FIG. 14B.

Figure 14C:
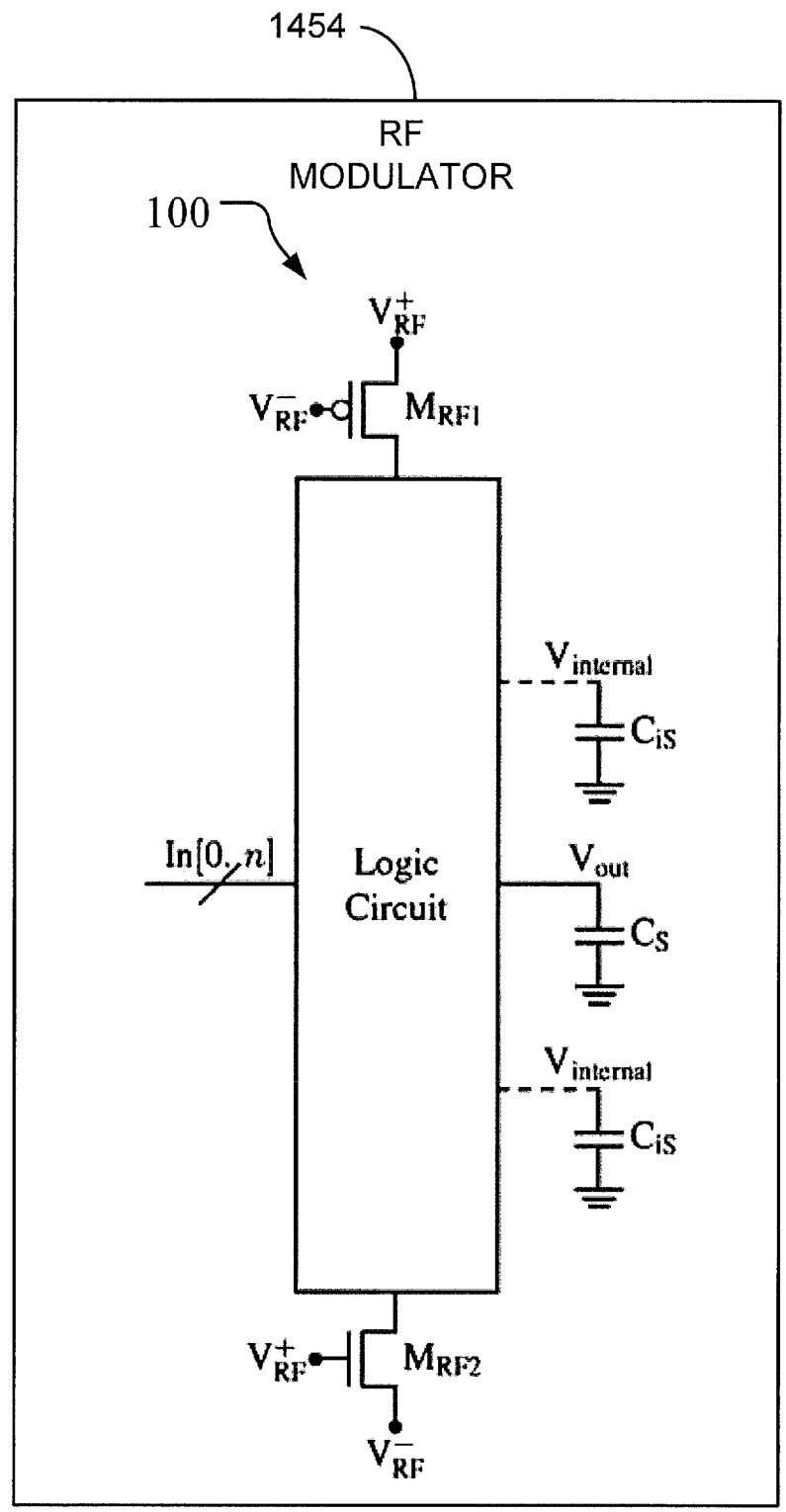
FIG. 14C is a block diagram illustrating an RF modulator including an AC powered logic circuit according to an embodiment of the subject matter described herein.

In yet another embodiment of the subject matter described herein, logic circuit 102 and transistors MRF1 and MRF2 may be components of an RF modulator 1454 as illustrated in FIG. 14C.

The application of the subject matter described herein is not limited to providing AC powered logic circuits. More specifically, the supply transistor configurations may provide DC power to any DC circuit, not just digital logic circuits. For example, an AC-DC power converter or rectifier circuit may be constructed using the supply transistor configurations described above. Such power converters could operate into the RF range, even with weak RF signals, making them ideal for harvesting energy in the RF range.

Figure 15:
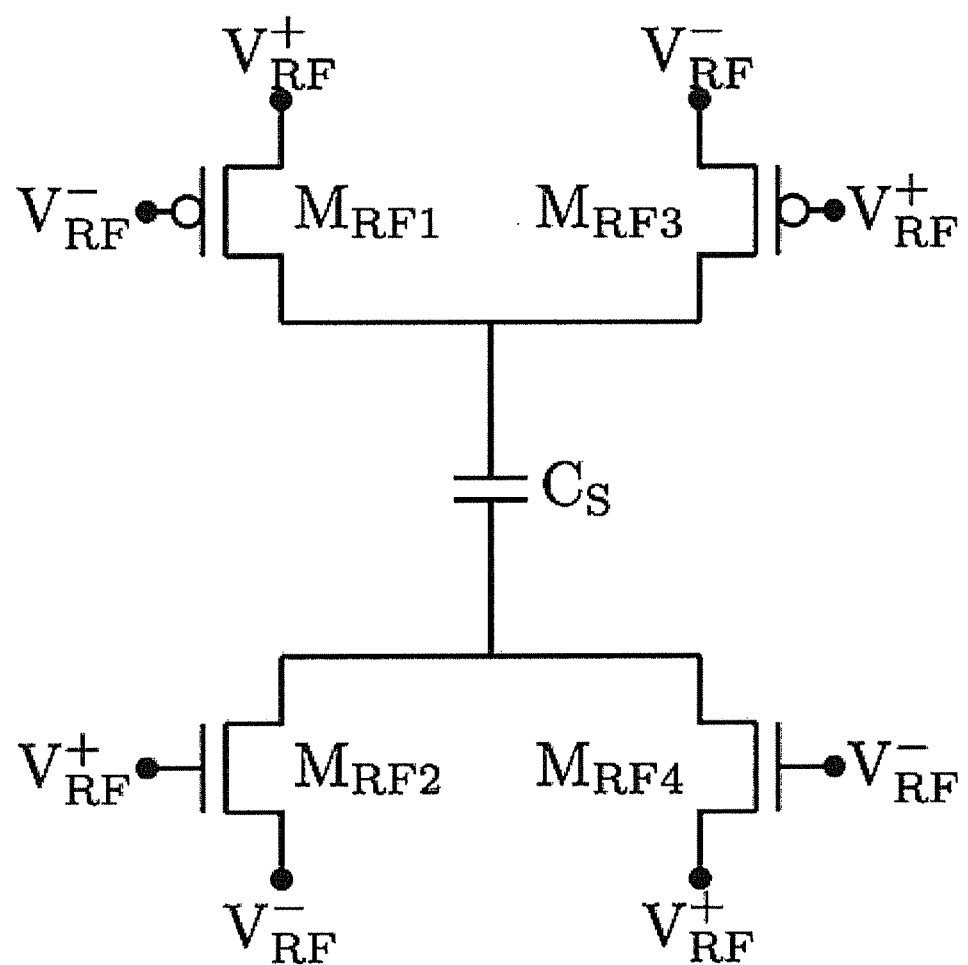
FIG. 15 is a circuit diagram illustrating an exemplary direct RF-DC rectification circuit according to an embodiment of the subject matter described herein.

FIG. 15 is a circuit diagram illustrating an exemplary direct RF-DC rectification circuit 1500 according to an embodiment of the subject matter described herein. In one embodiment, an AC-DC power converter would include a storage entity for storing electric charge and providing it as a DC output voltage, and at least one supply transistor connected to receive voltages of opposite phases from an AC power source such that the supply transistor is strongly on during a first phase of the voltage of the AC power source and is strongly off during a second phase opposite the first phase of the voltage of the AC power source. When they are strongly on, the supply transistors supply electric charge to the storage entity. When they are strongly off, the supply transistors electrically isolate the storage entity from the AC power source.

In the embodiment illustrated in FIG. 15, for example, multiple supply transistors MRF1-MRF4 are used to charge a storage capacitor Cs. Supply transistors MRF1 and MRF2 are active during one phase of the AC signals VRF+ and VFR− and supply transistors MRF3 and MRF4 are active during the opposite phase of these AC signals. In this manner, supply capacitor Cs is charged during both phases of the AC signal. Cs is charged over many cycles, eventually reaching a voltage of 2|VRF|.

In one embodiment, the terminals of Cs may be used to supply power to internal power buses. Thus, rather than providing separate supply transistors for each logic circuit, RF-DC rectifier 1500 can supply multiple logic circuits. The advantage of this structure is that after rectification, relatively normal DC circuits can be used. The disadvantage of this structure is that the capacitor would have to be relatively large, so as to provide a stable voltage for the follow-on circuits. This is a low-loss way to accumulate a DC voltage from the AC signal without incurring the losses of inverters or the large area associated with a long chain charge pump. If low-leakage capacitors are used (for example bonded on top of the silicon chip), then this charge can be stored for a long time. If a higher DC voltage is required, then Cs can be split into multiple capacitors for charging purposes and then reconfigured in series to provide a higher voltage (i.e. low-loss charge pump). This higher DC voltage could be used to charge a secondary battery. While particularly suitable for RF harvesting, the rectifier circuit illustrated in FIG. 15 operates at other AC frequencies, including those not traditionally considered within the radio frequency range.

In another embodiment, circuit 1500 may be used to generate constant logical 1 and 0 values for other logic circuits to use, in which case a smaller Cs may suffice.

Figure 16:
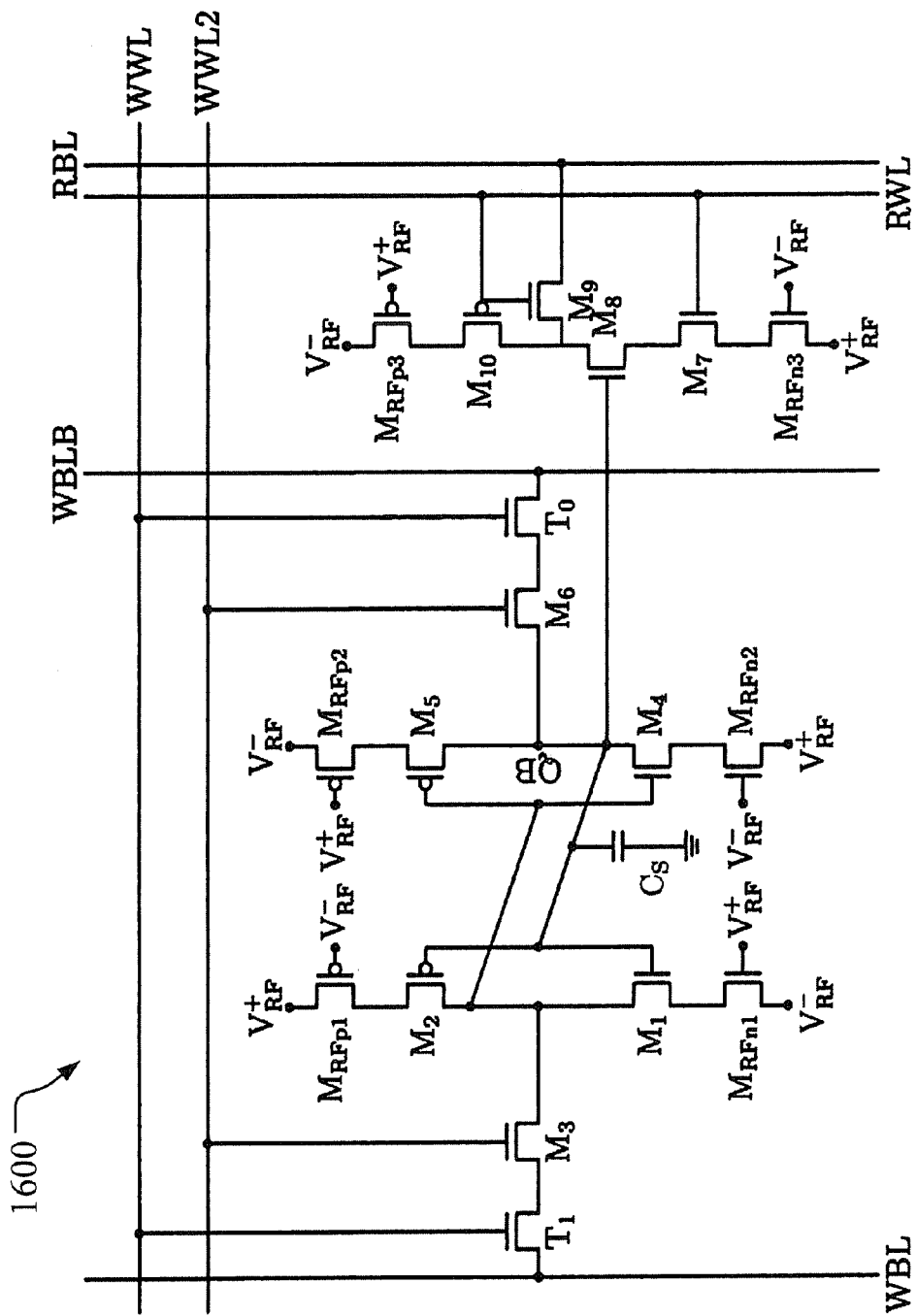
FIG. 16 is a circuit diagram of a subthreshold SRAM bit cell for AC powered logic circuits according to an embodiment of the subject matter described herein.

FIG. 16 is a circuit diagram of a subthreshold SRAM bit cell 1600 for AC powered logic circuits according to an embodiment of the subject matter described herein. In the embodiment illustrated in FIG. 16, transistors M1-M10, T1, and T2 form a CMOS 12 transistor (12-T) bit cell designed for robust static noise margin by reducing possible leakage from the cell. To ensure a robust hold static noise margin, an inner storage node capacitor Cs is added to protect the node from leakage during phase shifting. To ensure a robust read static noise margin, a cell-independent read path is utilized with a separated read bit line RBL and read word line RWL. This decreases the possibility of data leakage or flipping as compared to the conventional 6-T designs in which the write word line is raised for both writes and reads. With the cell-independent read path, only RWL is activated during a read, keeping storage node Cs isolated from the word bit lines WBL and WBLB during the read. The bit cell is optimized for the subthreshold realm of operation. Performance of the bit cell improves at higher voltage ranges (i.e. stability increases, static noise margins increase, time needed for writes and reads decreases, etc.) Bit cell 1600 can operate over a wide source frequency range, up to the switching limit of the transistor technology.

Bit cell 1600 includes supply transistors MRFp1 and MRFn1, which are active during one phase of AC supplies VRF+ and VRF−, supply transistors MRFp2 and MRFn2, which are active during the opposite phase of VRF+ and VRF−. Thus, bit cell 1600 operates as a pair of cross-coupled AC powered inverters. Capacitor Cs stores the data value during Toff. Transistors M7-M10, MRFp3, and MRFn3 operate as an amplifier performing a differential read.

Bit cell 1600 includes features that are not found in conventional six transistor (6-T) designs. For example, during a write to conventional 6-T cells, a write word line (equivalent to WWL in FIG. 16) is activated, which forces data onto the bit line of every bit cell in the same row, including those bit cells that are not currently selected. This raises the possibility that unselected bit cells may unintentionally be written to, a problem referred to as the pseudo-write or false-write problem. Bit cell 1600 avoids the false-write problem by the use of an additional word line (WWL2 in FIG. 16), which further isolates the bit cell by controlling transistors M3 and M6. WWL2 is selected by a column decoder, and is thus active only when that particular column is active. Additional access devices T1 and T2 also prevent false-writes. WWL is selected by a row decoder, and connects into the gates of access devices T1 and T2. The access devices M3, M6, T0, and T1 are shown as NMOS transistors, but could also be PMOS transistors or transmission gates. Thus, AC powered bit cell 1600 includes the additional features of dual phase supply transistors, additional word line WWL2, and additional access devices M3 and M6.

In conclusion, an alternative to RF to DC conversion is introduced that allows for subthreshold operation of logic circuits by applying the RF source directly, can be implemented with standard CMOS or pass-gate logic families, and utilize a set of supply transistors to direct the currents during the different phases of the RF source. Unlike previous implementations, these circuits will be able to operate at RF frequencies exceeding the data rate, which also means there is no power-on-reset is needed to control when storage of results is needed. The direct RF powering allows a lower operating voltage than conventional RF to DC conversion would permit. Measurements have demonstrated operation down to 112 mV RMS for the pass-gate XOR with a data rate up to 120 kb/s.

It will be understood that various details of the subject matter described herein may be changed without departing from the scope of the subject matter described herein. Furthermore, the foregoing description is for the purpose of illustration only, and not for the purpose of limitation.

What is claimed is:

1. A system including a logic circuit powered using an alternating current (AC) power source, the system comprising:
   at least one supply transistor connected to receive voltages of opposite phases from an AC power source such that the at least one supply transistor is strongly on during a first phase of the voltage of the AC power source and is strongly off during a second phase opposite the first phase of the voltage of the AC power source; and
   a first logic circuit connected to be powered by the AC power source through the at least one supply transistor and producing an output at an output terminal responsive to an input received at an input terminal.

2. The system of claim 1 comprising at least one supply transistor connected to receive voltages of opposite phases from the AC power source such that the at least one supply transistor is strongly off during the first phase of the voltage of the AC power source and is strongly on during the second phase opposite the first phase of the voltage of the AC power source.

3. The system of claim 2 wherein the first logic circuit is connected to be powered also by the AC power source through the at least one supply transistor that is strongly off during the first phase of the voltage of the AC power source and strongly on during the second phase of the AC power source.

4. The system of claim 2 comprising a second logic circuit connected to be powered by the AC power source through at least one supply transistor that is strongly off during the first phase of the voltage of the AC power source and strongly on during the second phase of the AC power source.

5. The system of claim 4 wherein the output of the first logic circuit is connected to an output of the second logic circuit and wherein the input of the first logic circuit is connected to an input of the second logic circuit.

6. The system of claim 4 wherein the output of the first logic circuit is connected to an input of the second logic circuit.

7. The system of claim 6 wherein an output of the second logic circuit is connected to the input of the first logic circuit.

8. The system of claim 1 comprising a capacitance associated with the output terminal of the first logic circuit for storing the output of the first logic circuit.

9. The system of claim 1 comprising a capacitance associated with an internal node of the first logic circuit for storing the state of the internal node of the first logic circuit.

10. The system of claim 1 wherein, when strongly on, the at least one supply transistor applies current to the first logic circuit for normal operation of the first logic circuit.

11. The system of claim 1 wherein, when strongly off, the at least one supply transistor reduces leakage current in the first logic circuit.

12. The system of claim 1 wherein the AC power source comprises a radio frequency (RF) AC power source.

13. The system of claim 1 wherein the AC power source comprises an inductively powered antenna.

14. The system of claim 13 comprising a second antenna, different from the inductively powered antenna, for communication.

15. The system of claim 1 comprising an AC powered sensor, wherein the at least one supply transistor and the at least one logic circuit are components of the AC powered sensor.

16. The system of claim 1 comprising an analog to digital converter, wherein the at least one supply transistor and the at least one logic circuit are components of the analog to digital converter.

17. The system of claim 1 comprising an AC power storage system consisting of a circuit containing reactive power components in which AC energy can be stored.

18. The system of claim 1 comprising an RF communications device, wherein the at least one supply transistor and the at least one logic circuit are components of the RF communications device.

19. The system of claim 1 comprising a clock generator, wherein the at least one supply transistor and the at least one logic circuit are components of the clock generator.

20. The system of claim 1 comprising an RF modulator, wherein the at least one supply transistor and the at least one logic circuit are components of the RF modulator.

21. The system of claim 1 comprising an RF receiver, wherein the at least one supply transistor and the at least one logic circuit are components of the RF receiver.

22. The system of claim 1 comprising a comparator, wherein the at least one supply transistor and the at least one logic circuit are components of the comparator.

23. The system of claim 1 comprising a memory storage cell, wherein the at least one supply transistor and the at least one logic circuit are components of the memory storage cell.

24. The system of claim 23 wherein the memory storage cell comprises at least one access device for isolating the memory storage cell from data presented during a write when the memory storage cell is not selected to be written to, wherein the at least one access device is controlled by an additional word line that is active only when the memory storage cell is selected to be written to.

25. An alternating current (AC) to direct current (DC) power converter, comprising:
   a storage entity for storing electric charge and providing it as a DC output voltage; and
   first, second, third and fourth supply transistors, the first and second supply transistors connected to receive voltages of opposite phases from an AC power source from the third and fourth supply transistors such that the first and second supply transistors are strongly on during a first phase of the voltage of the AC power source and strongly off during a second phase opposite the first phase of the voltage of the AC power source, and the third and fourth supply transistors are strongly on during the second phase of the voltage of the AC power source and strongly off during the first phase of the AC power source, wherein the storage entity comprises a capacitor having a first terminal connected to the first and third supply transistors and a second terminal connected to the second and fourth supply transistors such that the first and second terminals of the capacitor are connected to opposite phases of the AC power source in operation.

26. The power converter of claim 25 wherein the AC power source comprises a radio frequency (RF) AC power source.

27. The power converter of claim 25 wherein the AC power source comprises an inductively powered antenna.

28. The power converter of claim 25 wherein the storage entity comprises a capacitor.

* * * * *